United States Patent
Yu et al.

(10) Patent No.: US 11,024,578 B1
(45) Date of Patent: Jun. 1, 2021

(54) CONDUCTIVE COMPONENT AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventors: Zhe Yu, Guangdong (CN); Bangyin Peng, Guangdong (CN); Ilgon Kim, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/769,114

(22) PCT Filed: May 11, 2020

(86) PCT No.: PCT/CN2020/089542
§ 371 (c)(1),
(2) Date: Jun. 2, 2020

(30) Foreign Application Priority Data

Apr. 26, 2020 (CN) .......................... 202010338330.7

(51) Int. Cl.
*H01L 23/528* (2006.01)
*H01L 23/48* (2006.01)

(52) U.S. Cl.
CPC ........ *H01L 23/5283* (2013.01); *H01L 23/481* (2013.01)

(58) Field of Classification Search
CPC ............... H01L 23/5283; H01L 23/481; H01L 27/15–156
See application file for complete search history.

(56) References Cited

U.S. PATENT DOCUMENTS

2006/0226785 A1* 10/2006 Lin ........................... H01J 5/56
315/10

* cited by examiner

*Primary Examiner* — Herve-Louis Y Assouman

(57) ABSTRACT

The present invention provides a conductive component and a display device. The conductive component includes a first conductive line, wherein an end of the first conductive line includes a first narrow portion; and a second conductive line, wherein at least one end of the second conductive line includes a second narrow portion, the end of the second conductive line including the second narrow portion extends to the end of the first conductive line including the first narrow portion, and the first narrow portion and the second narrow portion engage with one another. The first narrow portion is bridged to the second narrow portion through a conductive block.

20 Claims, 2 Drawing Sheets

CONDUCTIVE COMPONENT AND DISPLAY DEVICE

FIELD OF INVENTION

The present disclosure relates to the field of display technology, and more particularly, to a conductive component and a display device.

BACKGROUND OF INVENTION

As shown in FIG. 1, FIG. 1 is a schematic plan view of a first metal line and a second metal line of traditional display panels connected by an indium tin oxide layer. As shown in FIG. 2, FIG. 2 is a schematic sectional view along a tangent line A-A in FIG. 1. The first metal line M1 and the second metal line M2 are located on a same straight line, the first metal line M1 and the second metal line M2 are located on different layers, and a width of an end of the first metal line M1 facing the second metal line M2 is equal to a width of an end of the second metal line M2 facing the first metal line M1. A first through-hole 1 is defined corresponding to the end of the first metal line M1 facing the second metal line M2, a second through-hole 2 is defined corresponding to the end of the second metal line M2 facing the first metal line M1, and an entirety of an indium tin oxide layer 3 is formed in the first through-hole 1 and the second through-hole 2, and electrically connects the first metal line M1 and the second metal line M2. Since an area of the indium tin oxide layer in the first through-hole 1 and the second through-hole 2 is smaller, current flowing through the indium tin oxide layer of the first through-hole 1 and the second through-hole 2 is greater, which may cause a risk of explosion damage to the indium tin oxide layer 3.

Therefore, a technical solution is necessary to be provided to solve the problem of explosion damage to the indium tin oxide layer.

SUMMARY OF INVENTION

A purpose of the present disclosure is to provide a conductive component and a display device to prevent a portion of a conductive block located in a first through-hole and a second through-hole and electrically connected the first conductive line and the second conductive line to be damaged by explosion.

In order to realize the above purpose, the present disclosure provides a conductive component. The conductive component comprises a first conductive line, wherein an end of the first conductive line comprises a first narrow portion; a second conductive line, wherein at least one end of the second conductive line comprises a second narrow portion, the end of the second conductive line comprising the second narrow portion extends to the end of the first conductive line comprising the first narrow portion, and the first narrow portion and the second narrow portion engage with one another; a first insulating layer, wherein the first insulating layer is located between the first conductive line and the second conductive line; a second insulating layer, wherein the second insulating layer is located on a side of the second conductive line away from the first insulating layer; a first through-hole, wherein the first through-hole is defined corresponding to the first narrow portion of the first conductive line and penetrates through the first insulating layer and the second insulating layer to expose the first narrow portion; a second through-hole, wherein the second through-hole is defined corresponding to the second narrow portion of the second conductive line and penetrates through the second insulating layer to expose the second narrow portion; and a conductive block, wherein the conductive block is located on a side of the second insulating layer away from the second conductive line, is formed in the first through-hole and the second through-hole and on the second insulating layer, and electrically connects to the first conductive line and the second conductive line. The first conductive line comprises at least one of molybdenum, aluminum, titanium, copper, or silver. The second conductive line comprises at least one of molybdenum, aluminum, titanium, copper, or silver. The conductive block comprises indium tin oxide.

In the above conductive component, a length of the first narrow portion is equal to a length of the second narrow portion, and a width of the first narrow portion is equal to a width of the second narrow portion.

In the above conductive component, the first through-hole is defined corresponding to an intermediate position in a length of the first narrow portion, and the second through-hole is defined corresponding to an intermediate position in a length of the second narrow portion.

In the above conductive component, the end of the first conductive line comprising the first narrow portion comprises a first groove, and the first groove is defined on a side of the first narrow portion. The end of the second conductive line comprising the second narrow portion comprises a second groove, and the second groove is defined on a side of the second narrow portion. The second narrow portion is located in the first groove, and the first narrow portion is located in the second groove.

In the above conductive component, both opposite ends of the second conductive line comprise the second narrow portions, the second narrow portion of one end of the second conductive line is electrically connected to one first narrow portion of the first conductive line by one conductive block, and the second narrow portion of another end of the second conductive line is electrically connected to another first narrow portion of the first conductive line by another conductive block.

A conductive component comprises a first conductive line, wherein an end of the first conductive line comprises a first narrow portion; a second conductive line, wherein at least one end of the second conductive line comprises a second narrow portion, the end of the second conductive line comprising the second narrow portion extends to the end of the first conductive line comprising the first narrow portion, and the first narrow portion and the second narrow portion engage with one another; a first insulating layer, wherein the first insulating layer is located between the first conductive line and the second conductive line; a second insulating layer, wherein the second insulating layer is located on a side of the second conductive line away from the first insulating layer; a first through-hole, wherein the first through-hole is defined corresponding to the first narrow portion of the first conductive line and penetrates through the first insulating layer and the second insulating layer to expose the first narrow portion; a second through-hole, wherein the second through-hole is defined corresponding to the second narrow portion of the second conductive line and penetrates through the second insulating layer to expose the second narrow portion; and a conductive block, wherein the conductive block is located on a side of the second insulating layer away from the second conductive line, is formed in the first through-hole and the second through-hole and on the second insulating layer, and electrically connects to the first conductive line and the second conductive line. The first conductive line comprises at least one of molybdenum, aluminum, titanium, copper, or silver. The second conductive line comprises at least one of molybdenum, aluminum, titanium, copper, or silver. The conductive block comprises indium tin oxide.

In the above conductive component, a length of the first narrow portion is equal to a length of the second narrow portion, and a width of the first narrow portion is equal to a width of the second narrow portion.

In the above conductive component, the first through-hole is defined corresponding to an intermediate position in a length of the first narrow portion, and the second through-hole is defined corresponding to an intermediate position in a length of the second narrow portion.

In the above conductive component, the end of the first conductive line comprising the first narrow portion comprises a first groove, and the first groove is defined on a side of the first narrow portion. The end of the second conductive line comprising the second narrow portion comprises a second groove, and the second groove is defined on a side of the second narrow portion. The second narrow portion is located in the first groove, and the first narrow portion is located in the second groove.

In the above conductive component, both opposite ends of the second conductive line comprise the second narrow portions, the second narrow portion of one end of the second conductive line is electrically connected to one first narrow portion of the first conductive line by one conductive block, and the second narrow portion of another end of the second conductive line is electrically connected to another first narrow portion of the first conductive line by another conductive block.

A display device comprises a conductive component. The conductive component comprises a first conductive line, wherein an end of the first conductive line comprises a first narrow portion; a second conductive line, wherein at least one end of the second conductive line comprises a second narrow portion, the end of the second conductive line comprising the second narrow portion extends to the end of the first conductive line comprising the first narrow portion, and the first narrow portion and the second narrow portion engage with one another; a first insulating layer, wherein the first insulating layer is located between the first conductive line and the second conductive line; a second insulating layer, wherein the second insulating layer is located on a side of the second conductive line away from the first insulating layer; a first through-hole, wherein the first through-hole is defined corresponding to the first narrow portion of the first conductive line and penetrates through the first insulating layer and the second insulating layer to expose the first narrow portion; a second through-hole, wherein the second through-hole is defined corresponding to the second narrow portion of the second conductive line and penetrates through the second insulating layer to expose the second narrow portion; and a conductive block, wherein the conductive block is located on a side of the second insulating layer away from the second conductive line, is formed in the first through-hole and the second through-hole and on the second insulating layer, and electrically connects to the first conductive line and the second conductive line. The first conductive line comprises at least one of molybdenum, aluminum, titanium, copper, or silver. The second conductive line comprises at least one of molybdenum, aluminum, titanium, copper, or silver. The conductive block comprises indium tin oxide.

In the above display device, a length of the first narrow portion is equal to a length of the second narrow portion, and a width of the first narrow portion is equal to a width of the second narrow portion.

In the above display device, the first through-hole is defined corresponding to an intermediate position in a length of the first narrow portion, and the second through-hole is defined corresponding to an intermediate position in the length of a second narrow portion.

In the above display device, the end of the first conductive line comprising the first narrow portion comprises a first groove, and the first groove is defined on a side of the first narrow portion. The end of the second conductive line comprising the second narrow portion comprises a second groove, and the second groove is defined on a side of the second narrow portion. The second narrow portion is located in the first groove, and the first narrow portion is located in the second groove.

In the above display device, both opposite ends of the second conductive line comprise the second narrow portions, the second narrow portion of one end of the second conductive line is electrically connected to one first narrow portion of the first conductive line by one conductive block, and the second narrow portion of another end of the second conductive line is electrically connected to another first narrow portion of the first conductive line by another conductive block.

The present disclosure provides a conductive component and a display device. The conductive component comprises a first conductive line, wherein an end of the first conductive line comprises a first narrow portion; a second conductive line, wherein at least one end of the second conductive line comprises a second narrow portion, the end of the second conductive line comprising the second narrow portion extends to the end of the first conductive line comprising the first narrow portion, and the first narrow portion and the second narrow portion engage with one another; a first insulating layer, wherein the first insulating layer is located between the first conductive line and the second conductive line; a second insulating layer, wherein the second insulating layer is located on a side of the second conductive line away from the first insulating layer; a first through-hole, wherein the first through-hole is defined corresponding to the first narrow portion of the first conductive line and penetrates through the first insulating layer and the second insulating layer to expose the first narrow portion; a second through-hole, wherein the second through-hole is defined corresponding to the second narrow portion of the second conductive line and penetrates through the second insulating layer to expose the second narrow portion; and a conductive block, wherein the conductive block is located on a side of the second insulating layer away from the second conductive line, is formed in the first through-hole and the second through-hole and on the second insulating layer, and electrically connects to the first conductive line and the second conductive line. Compared to traditional technology, one end of the first conductive line and one end of the second conductive line engage with one another to increase layout space of the first through-hole and second through-hole, thereby increasing an area of the conductive block in the first through-hole and the second through-hole, and preventing the conductive block from being damaged by explosion.

DETAILED DESCRIPTION OF PREFERRED EMBODIMENTS

The technical solutions in the embodiments of the present disclosure will be clearly and completely described below in conjunction with accompanying drawings in the embodiments of the present disclosure. Obviously, the embodiments described are merely a part of the present disclosure, rather than all the embodiments. All other embodiments obtained by the person having ordinary skill in the art based on embodiments of the disclosure, without making creative efforts, are within the scope of the present disclosure.

Figure 3:
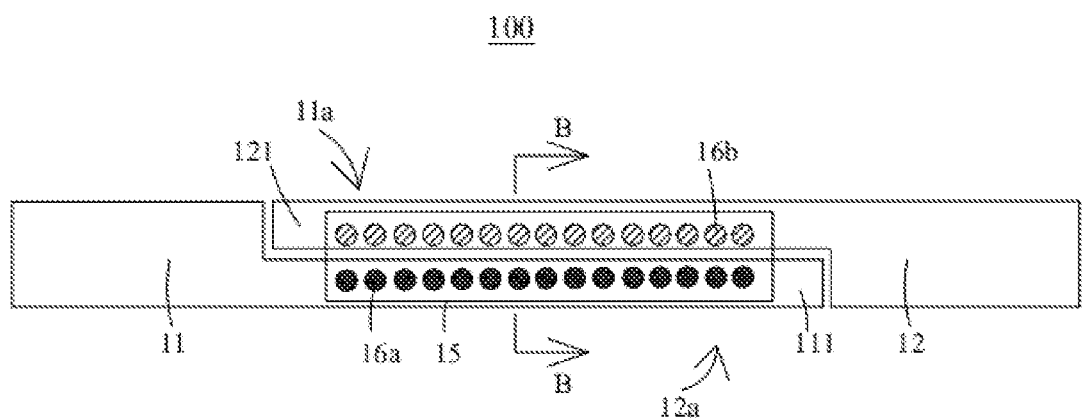
FIG. 3 is a schematic plan view of a conductive component of a first embodiment of the present disclosure.
Figure 4:
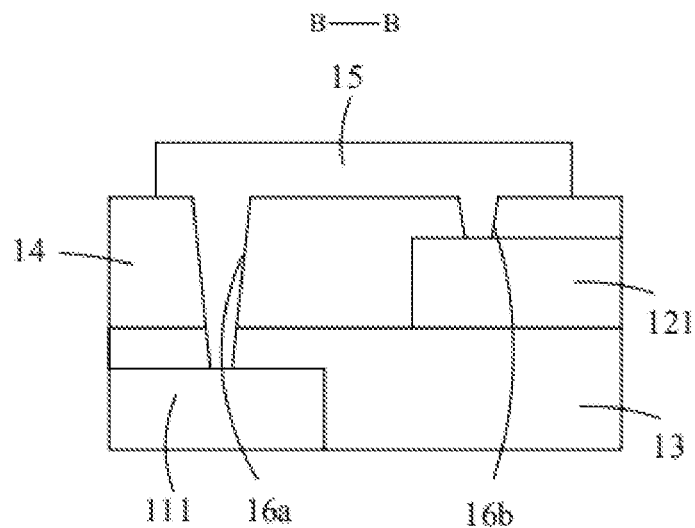
FIG. 4 is a schematic sectional view along a tangent line B-B in FIG. 3.

As shown in FIG. 3 and FIG. 4, FIG. 3 is a schematic plan view of a conductive component of a first embodiment of the present disclosure, and FIG. 4 is a schematic sectional view along a tangent line B-B in FIG. 3. The conductive component 100 comprises a first conductive line 11, a second conductive line 12, a first insulating layer 13, a second insulating layer 14, a first through-hole 16a, a second through-hole 16b, and a conductive block 15.

One end of the first conductive line 11 comprises a first narrow portion 111. A width of the other end of the first conductive line 11 is greater than a width of the first narrow portion 111. Specifically, the end of the first conductive line 11 comprising the first narrow portion 111 comprises a first groove 11a, and the first groove 11a is located on a side of the first narrow portion 111. The first groove 11a is defined corresponding to a second narrow portion 121, a size of the first groove 11a is equal to a size of the second narrow portion 121, and both the first groove 11a and the second narrow portion 121 are rectangular, that is, a length of the first groove 11a is equal to a length of the second narrow portion 121, and a width of the first groove 11a is equal to a width of the second narrow portion 121. The first conductive line 11 comprises at least one of molybdenum, aluminum, titanium, copper, or silver.

At least one end of the second conductive line 12 comprises the second narrow portion 121. The end of the second conductive line 12 comprising the second narrow portion 121 extends to the end comprising the first narrow portion 111, and the first narrow portion 111 and the second narrow portion 121 engage with one another. Specifically, the end of the second conductive line 12 comprising the second narrow portion 121 comprises a second groove 12a, the second groove 12a is located on a side of the second narrow portion 121, and the second narrow portion 121 is located in the first groove 11a. The second groove 12a is defined corresponding to the first narrow portion 111, both the second groove 12a and the first narrow portion 111 are rectangular, a length of the second groove 12a is equal to a length of the first narrow portion 111, and a width of the second groove 12a is equal to a width of the first narrow portion 111. The second conductive line 12 comprises at least one of molybdenum, aluminum, titanium, copper, or silver.

The first insulating layer 13 is located between the first conductive line 11 and the second conductive line 12 to insulate between the first conductive line 11 and the second conductive line 12. A thickness of the first insulating layer 13 ranges from 800 Å to 2000 Å, such as 1500 Å, and the first insulating layer comprises silicon nitride or silicon oxide.

The second insulating layer 14 is located on a side of the second conductive line 12 away from the first insulating layer 13. The second insulating layer 14 insulates the second conductive line 12 and the conductive block 15. A thickness of the second insulating layer 14 ranges from 3000 Å to 6000 Å. The second insulating layer 14 comprises silicon nitride or silicon oxide.

The first through-hole 16a is defined corresponding to the first narrow portion 111 of the first conductive line 11 and penetrates through the first insulating layer 13 and the second insulating layer 14 to expose the first narrow portion 111.

The second through-hole 16b is defined corresponding to the second narrow portion 121 of the second conductive line 12 and penetrates through the second insulating layer 14 to expose the second narrow portion 121.

The conductive block 15 is located on a side of the second insulating layer 14 away from the second conductive line 12, and the conductive block 15 is formed in the first through-hole 16a and the second through-hole 16b, and on the second insulating layer 14, and electrically connects to the first conductive line 11 and the second conductive line 12. The conductive block 15 is an entire conductive layer, and the conductive block 15 comprises indium tin oxide.

In the present embodiment, the first conductive line 11 and the second conductive line 12 are located on a same straight line. The length of the first narrow portion 111 is equal to the length of the second narrow portion 121, and the width of the first narrow portion 111 is equal to the width of the second narrow portion 121. The length of the first narrow portion 111 is greater than the width of the first narrow portion 111 to subsequently increase the number of the first through-holes 16a defined corresponding to the first narrow portion 111, and the length of the second narrow portion 121 is greater than the width of the second narrow portion 121 to subsequently increase the number of the second through-holes 16b defined corresponding to the second narrow portion 121, which increases an area of the conductive block 15 in the first through-hole 16a and the second through-hole 16b, and prevents the conductive block 15 from being damaged by explosion.

In the present embodiment, the first through-hole 16a is defined corresponding to an intermediate position in the length of the first narrow portion 111, and the second through-hole 16b is defined corresponding to an intermediate position in the length of the second narrow portion 121, so that the first through-hole 16a and the second through-hole 16b have a suitable number. Moreover, compared to the first through-hole 16a and the second through-hole 16b respectively disposed on both ends of the length of the first narrow portion 111 and both ends of the length of the second narrow portion 121, the present embodiment can reduce a probability of the conductive block 15 being damaged by explosion.

Specifically, the first through-hole 16a is arranged in a row along the length of the first narrow portion 111, and the second through-hole 16b is arranged in a row along the length of the second narrow portion 121, the sizes of the first through-hole 16a and the second through-hole 16b are equal, and one first through-hole 16a is defined corresponding to one second through-hole 16b.

Figure 5:
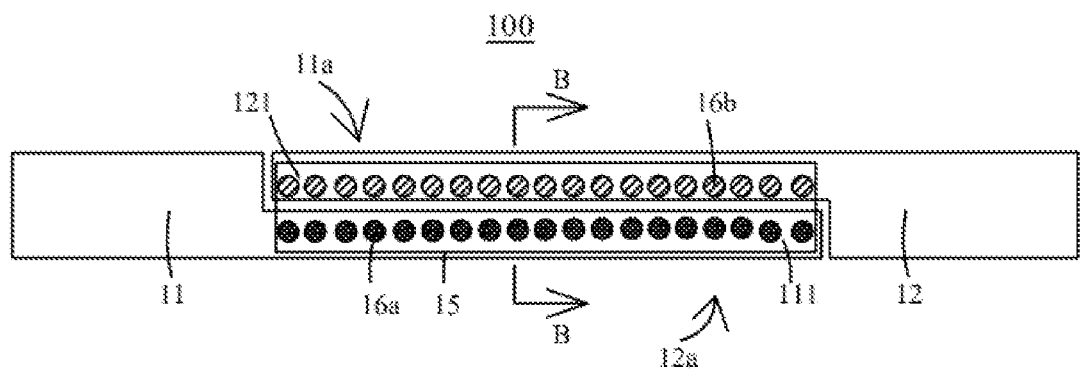
FIG. 5 is a schematic plan view of the conductive component of a second embodiment of the present disclosure.

Refer to FIG. 5, FIG. 5 is a schematic plan view of the conductive component of a second embodiment of the present disclosure. The conductive component shown in FIG. 5 is basically similar to the conductive component shown in FIG. 3, a difference is that the first through-hole 16a is defined corresponding to an entirety of the length of the first narrow portion 111, and the second through-hole 16b is defined corresponding to an entirety of the length of the second narrow portion 121, to maximize the number of the first through-holes 16a and the second through-holes 16b, and maximize the area of the conductive block 15 in the first through-hole 16a and the second through-hole 16b.

Compared to the conductive component of the first embodiment, although the number of first through-hole 16a and second through-hole 16b is increased in the present embodiment, an increase in the number of first through-hole 16a and second through-hole 16b also increases the probability of the conductive block 15 being damaged by explosion.

Figure 6:
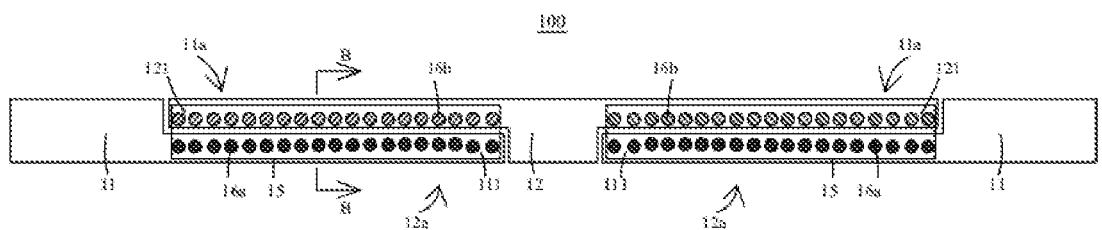
FIG. 6 is a schematic plan view of the conductive component of a third embodiment of the present disclosure.

Refer to FIG. 6, FIG. 6 is a schematic plan view of the conductive component of a third embodiment of the present disclosure. The conductive component shown in FIG. 6 is basically similar to the conductive component shown in FIG. 3, a difference is that both opposite ends of the second conductive line 12 comprises the second narrowed portions 121, the second narrow portion 121 of one end of the second conductive line 12 is electrically connected to one first narrow portion of the first conductive line 11 by one conductive block 15, and the second narrow portion 121 of another end of the second conductive line 12 is electrically connected to another first narrow portion 111 of the first conductive line 11 by another conductive block 15.

Two first conductive lines 11 on a same layer are electrically bridged by one second conductive line 12 to prevent a short-circuit between the first conductive line 11 and other conductive devices that need to be avoided.

The present disclosure further provides a display device. The display device may be a liquid crystal display device. The display device comprises a conductive component, and the conductive component may be disposed in a non-display region of the display device. The conductive component may form a conductive pad of the display device, and the conductive pad is configured to input data signals, scan control signals, etc. The conductive component may form conductive lines for transmitting the data signals. The conductive component comprises a first conductive line, wherein an end of the first conductive line comprises a first narrow portion; a second conductive line, wherein at least one end of the second conductive line comprises a second narrow portion, the end of the second conductive line comprising the second narrow portion extends to the end of the first conductive line comprising the first narrow portion, and the first narrow portion and the second narrow portion engage with one another; a first insulating layer, wherein the first insulating layer is located between the first conductive line and the second conductive line; a second insulating layer, wherein the second insulating layer is located on a side of the second conductive line away from the first insulating layer; a first through-hole, wherein the first through-hole is defined corresponding to the first narrow portion of the first conductive line and penetrates through the first insulating layer and the second insulating layer to expose the first narrow portion; a second through-hole, wherein the second through-hole is defined corresponding to the second narrow portion of the second conductive line and penetrates through the second insulating layer to expose the second narrow portion; and a conductive block, wherein the conductive block is located on a side of the second insulating layer away from the second conductive line, is formed in the first through-hole and the second through-hole and on the second insulating layer, and electrically connects to the first conductive line and the second conductive line.

In the present embodiment, a plurality of scanning lines and a plurality of data lines are disposed in a display region of the display device. The first conductive line and the plurality of scanning lines are located on a same metal layer, and the second conductive line and the plurality of data lines are located on the same metal layer. The first insulating layer is a gate insulating layer, a thickness of the gate insulating layer ranges from 800 Å to 2000 Å, and the gate insulating layer comprises silicon nitride or silicon oxide. The second insulating layer is an interlayer insulating layer, a thickness of the interlayer insulating layer ranges from 3000 Å to 6000 Å, and the interlayer insulating layer comprises silicon nitride or silicon oxide. When the display device is a liquid crystal display device, the conductive block and a pixel electrode may be disposed on a same layer and insulated.

In the present embodiment, the length of the first narrow portion is equal to the length of the second narrow portion, and the width of the first narrow portion is equal to the width of the second narrow portion, so that the first narrow portion and the second narrow portion are arranged symmetrically, which is advantageous for an electrical connection between the first narrow portion and the second narrow portion through the conductive block in the first through-hole and the second through-hole.

In the present embodiment, the end of the first conductive line comprising the first narrow portion comprises a first groove, and the first groove is defined on a side of the first narrow portion. The end of the second conductive line comprising the second narrow portion comprises a second groove, and the second groove is defined on a side of the second narrow portion. The second narrow portion is located in the first groove, and the first narrow portion is located in the second groove. An edge of the second narrow portion away from the first narrow portion is flush with an edge of the first groove away from the first narrow portion, and an edge of the first narrow portion away from the second narrow portion is flush with an edge of the second groove away from the second narrow portion, that is, the first narrow portion and the second groove engage with one another, and the second narrow portion and the second groove engage with one another.

In the present embodiment, shapes and sizes of the first through-hole and the second through-hole are equal. The shape of the first through-hole may be square, and the size of the first through-hole is 12 microns×12 microns. The shape of the first through-hole may also be circular.

Figure 1:
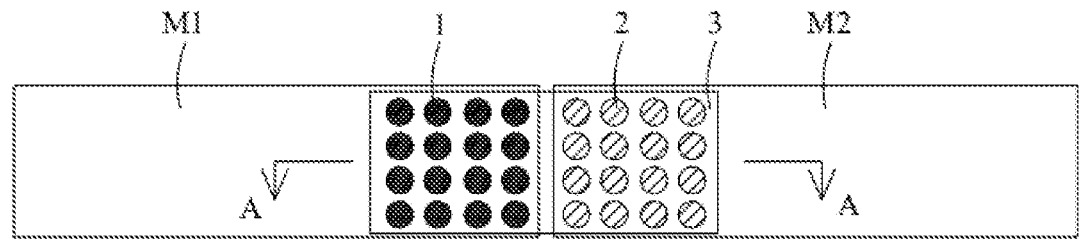
FIG. 1 is a schematic plan view of a first metal line and a second metal line of traditional display panels connected by an indium tin oxide layer.
Figure 2:
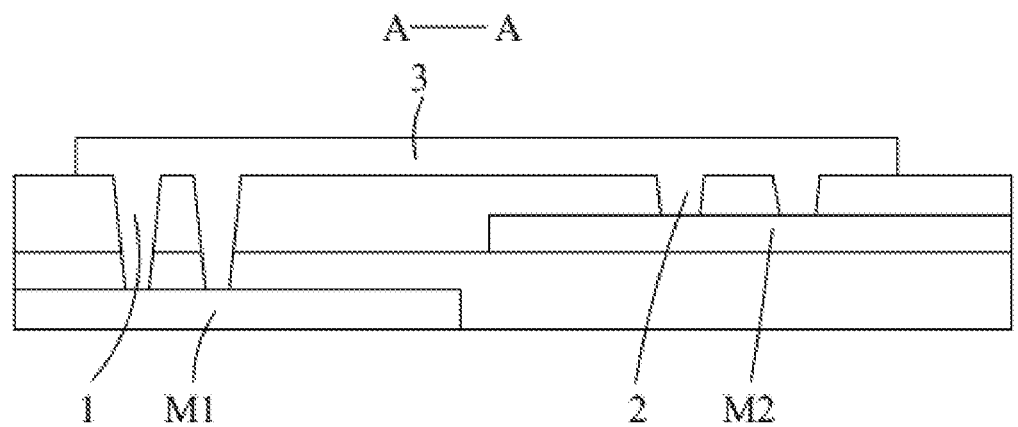
FIG. 2 is a schematic sectional view along a tangent line A-A in FIG. 1.

In the present embodiment, the first through-hole is defined corresponding to an intermediate position in the length of the first narrow portion, and the second through-hole is defined corresponding to an intermediate position in the length of the second narrow portion, so that the number of first through-holes and second through-holes is appropriately increased compared to traditional technology when an area of the first through-hole and the second through-hole is unchanged, thereby appropriately increasing a total sectional area of the conductive block in the first through-hole and the second through-hole. For example, the number of first through-holes 1 in FIG. 1 is 16, and the number of the first through-holes in the present disclosure is 44, which significantly increases the area of the conductive block in the first through-hole, preventing the conductive block within the through-hole from being damaged by explosion due to the greater current caused by the current flowing through a smaller area of the conductive block. The first through-hole is defined corresponding to an entirety of the first narrow portion, and the second through-hole is defined corresponding to an entirety of the length of second narrow portion, which prevents the problem that the excessive number of the first through-holes and the second through-holes results in a greater risk of the conductive block being damaged by explosion. Compared to the first through-hole defined corresponding to both ends of the first narrow portion and the second through-hole defined corresponding to both ends of the second narrow portion, the through-holes defined corresponding to the intermediate positions of the first narrow portion and the second narrow portion are more advantageous for reducing the risk of the conductive block being damaged by explosion.

In the present embodiment, both opposite ends of the second conductive line comprise the second narrow portions, the second narrow portion of one end of the second conductive line is electrically connected to one first narrow portion of the first conductive line by one conductive block, and the second narrow portion of another end of the second conductive line is electrically connected to another first narrow portion of the first conductive line by another conductive block. One second conductive line is electrically bridged to two first conductive lines to prevent the occurrence of short-circuits between the first conductive line and conductive devices between the first conductive lines that need to be avoided.

The descriptions of the above embodiments are only used to help understand technical solutions of the present disclosure and core ideas thereof. Moreover, those of ordinary skill in the art should understand that the technical solutions described in the aforesaid embodiments can still be modified, or have some technical features equivalently replaced. However, these modifications or replacements do not depart from a scope of the technical solutions of the embodiments of the present disclosure.

What is claimed is:

1. A conductive component, comprising:
   a first conductive line, wherein an end of the first conductive line comprises a first narrow portion;
   a second conductive line, wherein at least one end of the second conductive line comprises a second narrow portion, the end of the second conductive line comprising the second narrow portion extends to the end of the first conductive line comprising the first narrow portion, and the first narrow portion and the second narrow portion engage with one another;
   a first insulating layer, wherein the first insulating layer is located between the first conductive line and the second conductive line;
   a second insulating layer, wherein the second insulating layer is located on a side of the second conductive line away from the first insulating layer;
   a first through-hole, wherein the first through-hole is defined corresponding to the first narrow portion of the first conductive line and penetrates through the first insulating layer and the second insulating layer to expose the first narrow portion;
   a second through-hole, wherein the second through-hole is defined corresponding to the second narrow portion of the second conductive line and penetrates through the second insulating layer to expose the second narrow portion; and
   a conductive block, wherein the conductive block is located on a side of the second insulating layer away from the second conductive line, is formed in the first through-hole and the second through-hole and on the second insulating layer, and electrically connects to the first conductive line and the second conductive line;
   wherein the first conductive line comprises at least one of molybdenum, aluminum, titanium, copper, or silver;
   the second conductive line comprises at least one of molybdenum, aluminum, titanium, copper, or silver; and
   the conductive block comprises indium tin oxide.

2. The conductive component as claimed in claim 1, wherein a length of the first narrow portion is equal to a length of the second narrow portion, and a width of the first narrow portion is equal to a width of the second narrow portion.

3. The conductive component as claimed in claim 1, wherein the first through-hole is defined corresponding to an intermediate position in a length of the first narrow portion, and the second through-hole is defined corresponding to an intermediate position in a length of the second narrow portion.

4. The conductive component as claimed in claim 1, wherein the end of the first conductive line comprising the first narrow portion comprises a first groove, and the first groove is defined on a side of the first narrow portion;
   the end of the second conductive line comprising the second narrow portion comprises a second groove, and the second groove is defined on a side of the second narrow portion; and
   the second narrow portion is located in the first groove, and the first narrow portion is located in the second groove.

5. The conductive component as claimed in claim 1, wherein both opposite ends of the second conductive line comprise the second narrow portions, the second narrow portion of one end of the second conductive line is electrically connected to one first narrow portion of the first conductive line by one conductive block, and the second narrow portion of another end of the second conductive line is electrically connected to another first narrow portion of the first conductive line by another conductive block.

6. A conductive component, comprising:
   a first conductive line, wherein an end of the first conductive line comprises a first narrow portion;
   a second conductive line, wherein at least one end of the second conductive line comprises a second narrow portion, the end of the second conductive line comprising the second narrow portion extends to the end of the first conductive line comprising the first narrow portion, and the first narrow portion and the second narrow portion engage with one another;
   a first insulating layer, wherein the first insulating layer is located between the first conductive line and the second conductive line;
   a second insulating layer, wherein the second insulating layer is located on a side of the second conductive line away from the first insulating layer;
   a first through-hole, wherein the first through-hole is defined corresponding to the first narrow portion of the first conductive line and penetrates through the first insulating layer and the second insulating layer to expose the first narrow portion;
   a second through-hole, wherein the second through-hole is defined corresponding to the second narrow portion of the second conductive line and penetrates through the second insulating layer to expose the second narrow portion; and a conductive block, wherein the conductive block is located on a side of the second insulating layer away from the second conductive line, is formed in the first through-hole and the second through-hole and on the second insulating layer, and electrically connects to the first conductive line and the second conductive line.

7. The conductive component as claimed in claim 6, wherein a length of the first narrow portion is equal to a length of the second narrow portion, and a width of the first narrow portion is equal to a width of the second narrow portion.

8. The conductive component as claimed in claim 6, wherein the first through-hole is defined corresponding to an intermediate position in a length of the first narrow portion, and the second through-hole is defined corresponding to an intermediate position in a length of the second narrow portion.

9. The conductive component as claimed in claim 6, wherein the end of the first conductive line comprising the first narrow portion comprises a first groove, and the first groove is defined on a side of the first narrow portion;
the end of the second conductive line comprising the second narrow portion comprises a second groove, and the second groove is defined on a side of the second narrow portion; and
the second narrow portion is located in the first groove, and the first narrow portion is located in the second groove.

10. The conductive component as claimed in claim 6, wherein both opposite ends of the second conductive line comprise the second narrow portions, the second narrow portion of one end of the second conductive line is electrically connected to one first narrow portion of the first conductive line by one conductive block, and the second narrow portion of another end of the second conductive line is electrically connected to another first narrow portion of the first conductive line by another conductive block.

11. The conductive component as claimed in claim 6, wherein the conductive component is a conductive pad.

12. The conductive component as claimed in claim 6, wherein the first conductive line and the second conductive line are located on a same straight line.

13. A display device, wherein the display device comprises a conductive component, and the conductive component comprises:
a first conductive line, wherein an end of the first conductive line comprises a first narrow portion;
a second conductive line, wherein at least one end of the second conductive line comprises a second narrow portion, the end of the second conductive line comprising the second narrow portion extends to the end of the first conductive line comprising the first narrow portion, and the first narrow portion and the second narrow portion engage with one another;
a first insulating layer, wherein the first insulating layer is located between the first conductive line and the second conductive line;
a second insulating layer, wherein the second insulating layer is located on a side of the second conductive line away from the first insulating layer;
a first through-hole, wherein the first through-hole is defined corresponding to the first narrow portion of the first conductive line and penetrates through the first insulating layer and the second insulating layer to expose the first narrow portion;
a second through-hole, wherein the second through-hole is defined corresponding to the second narrow portion of the second conductive line and penetrates through the second insulating layer to expose the second narrow portion; and
a conductive block, wherein the conductive block is located on a side of the second insulating layer away from the second conductive line, is formed in the first through-hole and the second through-hole and on the second insulating layer, and electrically connects to the first conductive line and the second conductive line.

14. The display device as claimed in claim 13, wherein a length of the first narrow portion is equal to a length of the second narrow portion, and a width of the first narrow portion is equal to a width of the second narrow portion.

15. The display device as claimed in claim 13, wherein the first through-hole is defined corresponding to an intermediate position in a length of the first narrow portion, and the second through-hole is defined corresponding to an intermediate position in a length of the second narrow portion.

16. The display device as claimed in claim 13, wherein the end of the first conductive line comprising the first narrow portion comprises a first groove, and the first groove is defined on a side of the first narrow portion;
the end of the second conductive line comprising the second narrow portion comprises a second groove, and the second groove is defined on a side of the second narrow portion; and
the second narrow portion is located in the first groove, and the first narrow portion is located in the second groove.

17. The display device as claimed in claim 13, wherein both opposite ends of the second conductive line comprise the second narrow portions, the second narrow portion of one end of the second conductive line is electrically connected to one first narrow portion of the first conductive line by one conductive block, and the second narrow portion of another end of the second conductive line is electrically connected to another first narrow portion of the first conductive line by another conductive block.

18. The display device as claimed in claim 13, wherein the conductive component is disposed in a non-display region of the display device.

19. The display device as claimed in claim 13, wherein the conductive component is a conductive pad.

20. The display device as claimed in claim 13, wherein the first conductive line and the second conductive line are located on a same straight line.

* * * * *